(12) United States Patent

Okabayashi et al.

(10) Patent No.: US 6,751,773 B2
(45) Date of Patent: Jun. 15, 2004

(54) CODING APPARATUS CAPABLE OF HIGH SPEED OPERATION

(75) Inventors: Kazuhiro Okabayashi, Kyoto (JP); Minoru Okamoto, Osaka (JP); Masayuki Yamasaki, Osaka (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 389 days.

(21) Appl. No.: 09/833,061

(22) Filed: Apr. 12, 2001

(65) Prior Publication Data

US 2002/0002694 A1 Jan. 3, 2002

(30) Foreign Application Priority Data

Apr. 13, 2000 (JP) ........................................ 2000-111751

(51) Int. Cl.[7] ............................................. H03M 13/03
(52) U.S. Cl. ..................................................... 714/786
(58) Field of Search ................................ 714/751, 746, 714/784–786

(56) References Cited

U.S. PATENT DOCUMENTS

| 4,626,711 A | 12/1986 | Li | 326/52 |
| 4,720,829 A * | 1/1988 | Fukasawa et al. | 714/707 |
| 5,193,094 A | 3/1993 | Viterbi | 714/795 |
| 6,467,063 B1 * | 10/2002 | Fukuoka | 714/784 |

FOREIGN PATENT DOCUMENTS

| EP | 0 750 401 A2 | 12/1996 |
| JP | 11-46148 | 2/1999 |

* cited by examiner

*Primary Examiner*—Albert Decady
*Assistant Examiner*—Shelly A Chase
(74) *Attorney, Agent, or Firm*—McDermott, Will & Emery (57) ABSTRACT

A coding apparatus includes shift register, input register and logical operation section. The shift register performs bit shifting on an input bit sequence and stores one bit of the input bit sequence after another. The input register stores coefficients of terms on respective orders of a generator polynomial. The logical operation section obtains logical products of the respective bits stored on the shift register and associated bits stored on the input register and a logical product of each one bit input to the shift register and an associated bit stored on the input register so that the earlier a bit of the input bit sequence was input, the higher-order one of the coefficients in the terms of the polynomial the input bit is associated with. Next, the logical operation section derives an exclusive logical sum of the products and then outputs the sum as a bit of a code sequence.

12 Claims, 6 Drawing Sheets

Prior Art

FIG. 9

Prior Art

CODING APPARATUS CAPABLE OF HIGH SPEED OPERATION

BACKGROUND OF THE INVENTION

The present invention relates to a coding apparatus for generating a convolutional code sequence for use mainly in telecommunications.

In the field of mobile communications, a convolutional code is often used. This is because bit errors, frequently occurring while information is transmitted, require error correction coding after the information has been received. On the other hand, it is indispensable for mobile telecommunications units of today to perform signal processing using a digital signal processor (DSP).

Figure 2:
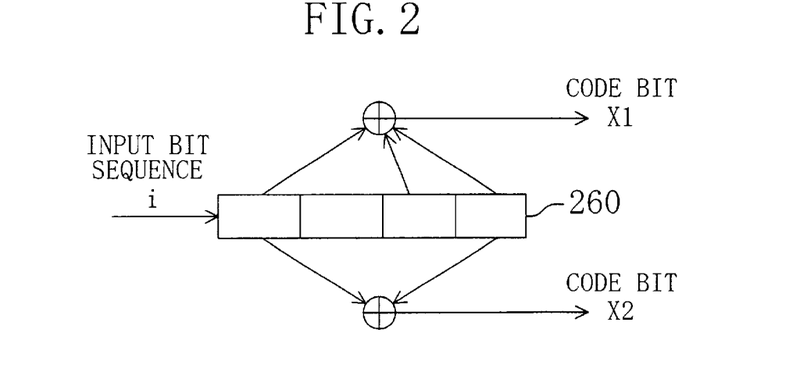
FIG. 2 is a block diagram illustrating a conceptual configuration for a convolutional coding apparatus.

A convolutional code bit is generated by performing addition modulo 2 on an input bit and a number of preceding bits. For example, where the number of preceding bits is K-1, the constraint length is K. And if a number n of bits have been generated with respect to a single input bit, the code rate (which will be herein simply called a "rate") is 1/n. FIG. 2 illustrates a configuration for a known convolutional coding apparatus. In the example illustrated in FIG. 2, the convolutional coding apparatus has a constraint length of 4 and a rate of ½.

To generate a convolutional code bit, an exclusive logical sum should be obtained for a bit sequence consisting of the number K of bits, i.e., an input bit and a number K-1 of preceding bits. In getting a program executed by a known DSP using normal instructions, it usually takes several processing steps to code an input bit and obtain one code bit.

Figure 4:
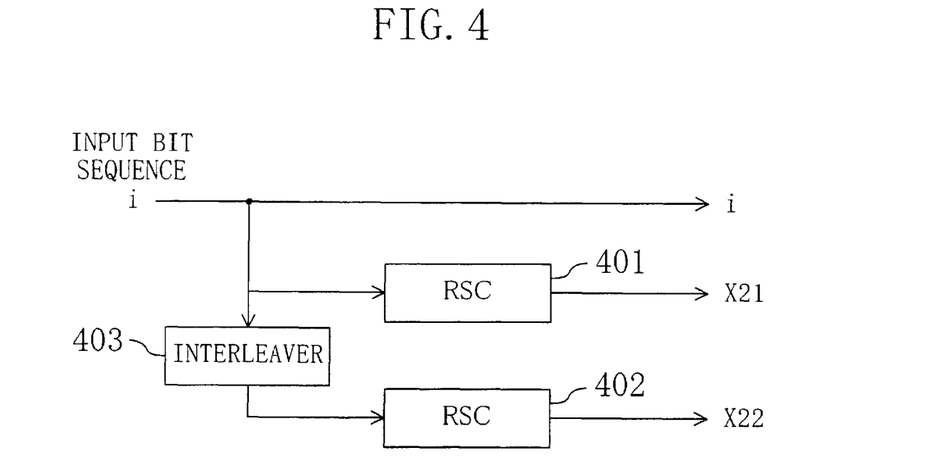
FIG. 4 is a block diagram illustrating a basic configuration for a coding apparatus for generating a turbo code sequence.

Recently, a turbo coding scheme has attracted much attention as a new coding method that can approach the Shannon limit. FIG. 4 is a block diagram illustrating a configuration for a coding apparatus that generates a turbo code sequence. As shown in FIG. 4, the apparatus includes an interleaver 403 and recursive systematic convolutional (RSC) coders 401 and 402. Each of the RSC coders 401 and 402 may have a configuration such as that illustrated in FIG. 5.

Figure 8:
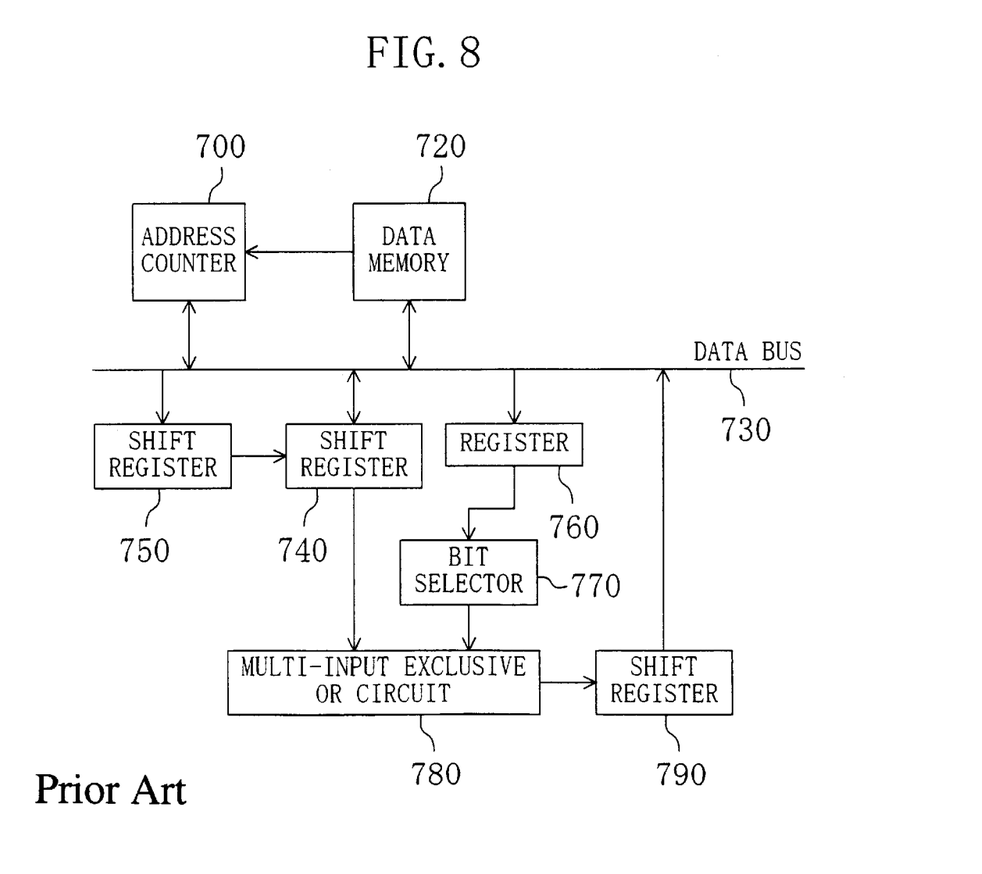
FIG. 8 is a block diagram illustrating a known processor.
Figure 9:
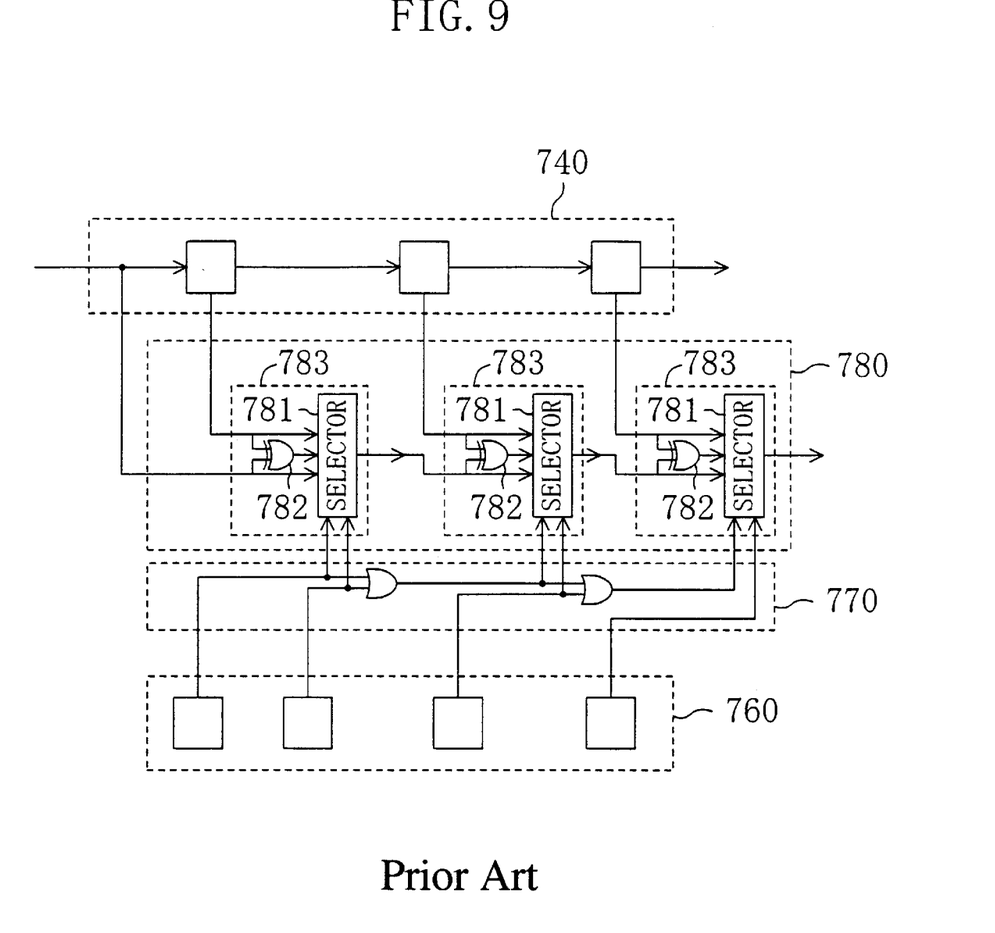
FIG. 9 is a circuit diagram illustrating a detailed configuration for the multi-input exclusive OR circuit shown in FIG. 8.

Also, Japanese Laid-Open Publication No. 11-46148 discloses a processor that can generate convolutional and turbo code sequences fast enough. FIG. 8 is a block diagram illustrating a processor as disclosed in the publication identified above. FIG. 9 is a circuit diagram illustrating a detailed configuration for the multi-input exclusive OR circuit 780 shown in FIG. 8.

In the processor shown in FIG. 9, a register 760 stores bit select data, from which a convolutional code sequence will be generated. The respective bits of the bit select data are input to a bit selector 770 The multi-input exclusive OR circuit 780 includes three-input, one-output selectors 781. The outputs of the bit selector 770 are supplied as select signals to these three-input, one-output selectors 781.

As also shown in FIG. 9, a shift register 740 stores a number of preceding bits, which are respectively input to the multi-input exclusive OR circuit 780. The output of the multi-input exclusive OR circuit 780 is the convolutional code sequence generated, which will be stored on the shift register 790 shown in FIG. 8.

The known processor shown in FIG. 9, however, needs the bit selector 770. Also, the multi-input exclusive OR circuit 780 is made up of unit construction blocks 783, each including a single exclusive OR gate 782 and a single three-input selector 781. Accordingly, where the constraint length is K, the processor should perform coding by cascading a number K-1 of unit construction blocks 783 together.

A circuit of this type increases its size as the constraint length K increases. In addition, since the unit construction blocks 783 are cascaded, the number of gate stages between its input and output terminals is excessively great. For these reasons, the circuit is not effectively applicable to high-speed processing.

SUMMARY OF THE INVENTION

It is therefore an object of the present invention to provide a downsized coding apparatus that can generate a convolutional code sequence much faster.

A coding apparatus according to the present invention includes first shift register, input register and logical operation section. The first shift register performs bit shifting on an input bit sequence and stores one bit of the input bit sequence after another. The input register stores coefficients of terms on respective orders of a generator polynomial. The logical operation section obtains logical products of the respective bits stored on the first shift register and associated bits stored on the input register and a logical product of each one bit input to the first shift register and an associated bit stored on the input register so that the earlier a bit of the input bit sequence was input, the higher-order one of the coefficients in the terms of the polynomial the input bit is associated with. Next, the logical operation section derives an exclusive logical sum of the logical products obtained and then outputs the sum as one bit of a code sequence.

In the inventive apparatus, the logical products of multiple contiguous bits of an input bit sequence and their associated coefficients in the terms on respective orders of a generator polynomial are obtained in parallel. Accordingly, each bit of a code sequence can be obtained in a much shorter time and the convolutional coding process can be carried out far more efficiently. In addition, the values stored on the input register are freely changeable to generate a convolutional code bit in accordance with an arbitrary generator polynomial.

In one embodiment of the present invention, the inventive apparatus preferably further includes a second shift register for storing the input bit sequence thereon. The second shift register preferably performs bit shifting on the input bit sequence and outputs one bit of the input bit sequence after another to the first shift register.

In another embodiment of the present invention, the logical operation section preferably includes: a plurality of AND gates for obtaining the respective logical products; and a plurality of exclusive OR gates for obtaining the exclusive logical sum. The number of gates existing between one of the AND gates and a last-stage one of the exclusive OR gates should be different from the number of gates existing between another one of the AND gates and the last-stage exclusive OR gate by no greater than one.

In such an embodiment, it takes a much shorter time to derive an exclusive logical sum of the logical products obtained, thus speeding up the convolutional coding process.

Where the inventive apparatus includes the second shift register, the apparatus preferably further includes a memory for storing and then outputting the input bit sequence. And the logical operation section preferably gets the code sequence stored on the memory.

In another embodiment, the logical operation section preferably outputs the code sequence to the second shift register. And the second shift register preferably allocates one bit of the code sequence after another to a bit position at which no bit of the input bit sequence is stored anymore as a result of the bit shifting.

An inventive digital signal processor includes the coding apparatus according to any of the foregoing embodiments and an arithmetic and logic unit. In the digital signal processor, the input register is connected to the arithmetic and logic unit.

Another inventive digital signal processor is integrated on the same semiconductor substrate along with the coding apparatus according to any of the foregoing embodiments.

Another inventive coding apparatus includes shift register, first and second input registers and first and second logical operation sections. The shift register performs bit shifting and stores one input bit after another. The first input register stores coefficients of terms on respective orders of a first generator polynomial, while the second input register stores coefficients of terms on respective orders of a second generator polynomial. The first logical operation section obtains logical products of the respective bits stored on the shift register and associated bits stored on the first input register so that the earlier a bit was input to the shift register, the higher-order one of the coefficients in the terms of the first polynomial the input bit is associated with. Next, the first logical operation section derives an exclusive logical sum of the logical products obtained and a currently input bit of an input bit sequence and then outputs the sum to the shift register. The second logical operation section obtains logical products of the respective bits stored on the shift register and associated bits stored on the second input register and a logical product of each one bit input to the shift register and an associated bit stored on the second input register so that the earlier the bit was input to the shift register, the higher-order one of the coefficients in the terms of the second polynomial the input bit is associated with. Next, the second logical operation section derives an exclusive logical sum of the logical products obtained and then outputs the sum as one bit of a code sequence.

An inventive coding method includes the step of performing bit shifting on an input bit sequence and storing one bit of the input bit sequence after another on a shift register. The method further includes the step of obtaining logical products of the respective bits stored on the shift register and associated bits stored on an input register and a logical product of each one bit input to the shift register and an associated bit stored on the input register so that the earlier a bit of the input bit sequence was input, the higher-order one of coefficients in respective terms of a generator polynomial the input bit is associated with. The coefficients of the polynomial are stored on the input register. And the method further includes the step of deriving an exclusive logical sum of the logical products obtained and then outputting the sum as one bit of a code sequence.

Another inventive coding method includes the step of performing bit shifting and storing one input bit after another on a shift register. The method further includes the step of obtaining logical products of the respective bits stored on the shift register and associated bits stored on a first input register so that the earlier a bit was input to the shift register, the higher-order one of coefficients in respective terms of a first generator polynomial the input bit is associated with. The coefficients of the first generator polynomial are stored on the first input register. The method further includes the step of deriving an exclusive logical sum of the logical products obtained and a currently input bit of an input bit sequence and then outputting the sum to the shift register. The method further includes the step of obtaining logical products of the respective bits stored on the shift register and associated bits stored on a second input register and a logical product of each one bit input to the shift register and an associated bit stored on the second input register so that the earlier the bit was input to the shift register, the higher-order one of coefficients in respective terms of a second generator polynomial the input bit is associated with. The coefficients of the second generator polynomial are stored on the second input register. And the method further includes the step of deriving an exclusive logical sum of the logical products obtained and then outputting the sum as one bit of a code sequence.

Still another inventive digital signal processor realizes a coding method according to any of the two aspects of the present invention described above by executing a single instruction.

DESCRIPTION OF THE PREFERRED EMBODIMENTS

Hereinafter, preferred embodiments of the present invention will be described with reference to the accompanying drawings.

Embodiment 1

Figure 1:
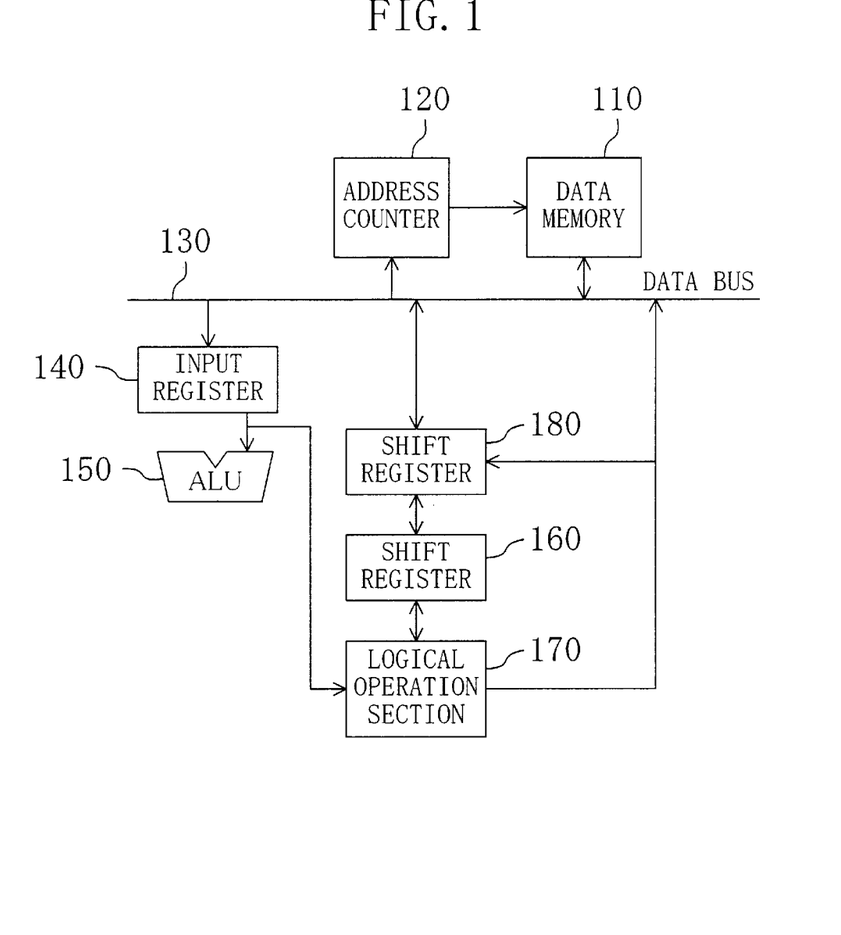
FIG. 1 is a block diagram illustrating an arrangement for a coding apparatus according to a first embodiment of the present invention.

FIG. 1 is a block diagram illustrating an arrangement for a coding apparatus according to a first embodiment of the present invention. The apparatus shown in FIG. 1 performs convolutional coding on input data (or more exactly, an input bit sequence) to generate and output a convolutional code sequence. As shown in FIG. 1, the apparatus includes data memory 110, address counter 120, input register 140, first and second shift registers 160 and 180 and logical operation section 170. That is to say, the apparatus shown in FIG. 1 includes not only components normally provided for a general purpose DSP but also the logical operation section 170. In FIG. 1, the arithmetic and logic unit (ALU) 150 is in no direct connection with coding processing. The input register 140 outputs it stored data to the ALU 150 and can function an input register for the ALU 150.

In the following description, most and least significant bits stored in each register and each shift register will be simply referred to as "MSB" and "LSB", respectively.

FIG. 2 is a block diagram illustrating a conceptual configuration for a convolutional coding apparatus. As shown in FIG. 2, an input bit sequence i is input one bit after another as data to be coded to the LSB of a 4-bit shift register 260. Also, every time one bit is newly input to the shift register 260, the data, which has been stored on the shift register 260, is shifted one position to the left (i.e., toward the MSB).

In FIG. 2, a convolutional code bit X1 is generated by obtaining an exclusive logical sum of the first, second and fourth most significant bits of the shift register 260 in accordance with a generator polynomial $1+D^2+D^3$, where D is a delay operator. In the same way, another convolutional code bit X2 is generated by obtaining an exclusive logical sum of the first and fourth most significant bits of the shift register 260 in accordance with another generator polynomial $1+D^3$.

Figure 3:
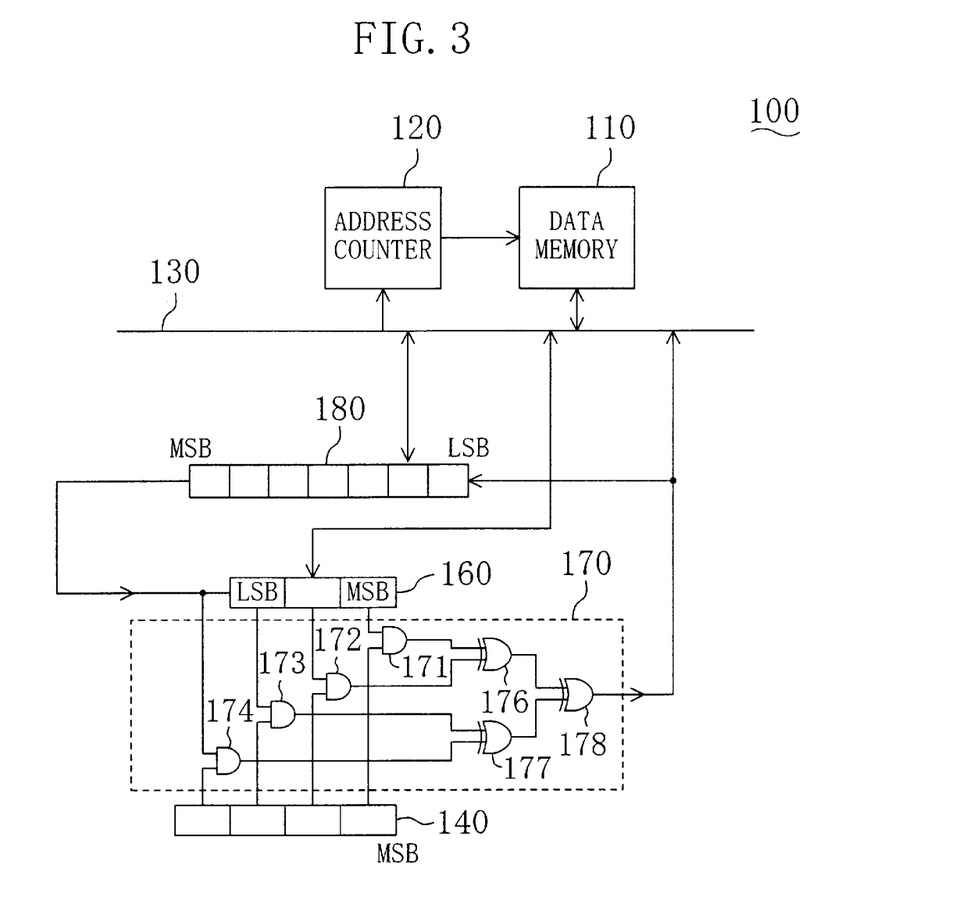
FIG. 3 is a circuit diagram illustrating the coding apparatus of the first embodiment.

FIG. 3 is a circuit diagram illustrating part of the coding apparatus shown in FIG. 1 in further detail. In the following example, it will be described how the coding apparatus 100 shown in FIG. 3 generates the convolutional code bits X1 and X2 shown in FIG. 2.

First, the convolutional code bit X1 is generated in the following manner. The data memory 110 stores an input bit sequence to be coded. The address counter 120 counts two addresses P0 and P1. Specifically, the address counter 120 defines the address at the top of a memory region, on which the data memory 110 now stores the input bit sequence, as the address P0. The address counter 120 also defines the top address of a memory region, at which the convolutional code bit X1 generated is stored, as the additional address P1.

The input register 140 stores the coefficients of respective terms of the generator polynomial $1+D^2+D^3$, which is used to generate the convolutional code bit X1 shown in FIG. 2, thereon in this order (i.e., "1", "0", "1" and "1") so that the coefficient of the highest-order term is stored as the MSB thereof.

The data memory 110 reads out and outputs a data word beginning with the address P0 as indicated by the address counter 120 so that the data word is transferred through the data bus 130 and then stored on the second shift register 180. Then, the address counter 120 increments the address P0 by one.

Every time the data word is input thereto, the second shift register 180 outputs the MSB of the data that has been stored thereon. And the MSB output is supplied to the first shift register 160 so that the MSB will be stored at the LSB position thereof after the bits stored on the first shift register 160 have been shifted one position to the left. That is to say, the MSB is the bit currently input to the first shift register 160. The logical operation section 170 needs four bits, including the currently input one, out of the input bit sequence. Accordingly, the first shift register 160 can store three bits that were input thereto in the previous three cycles before the MSB of the second shift register 180 is input thereto as the current one. The first shift register 160 stores zero bits at all these three bit positions for initialization purposes.

As shown in FIG. 3, the logical operation section 170 includes AND gates 171, 172, 173 and 174 and exclusive OR gates 176, 177 and 178. The logical operation section 170 performs convolution coding on the bit currently input to the first shift register 160 and the three bits currently stored on the first shift register 160 in accordance with the generator polynomial for the input register 140 to generate and output the convolutional code bit X1.

Specifically, the AND gate 171 receives the MSBs of the input register 140 and first shift register 160, obtains a logical product of these bits and then outputs the product to the exclusive OR gate 176. The AND gate 172 receives the second most significant bits of the input register 140 and first shift register 160, obtains a logical product of these bits and then outputs the product to the exclusive OR gate 176.

In the same way, the AND gate 173 receives the third most significant bits of the input register 140 and first shift register 160, obtains a logical product of these bits and then outputs the product to the exclusive OR gate 177. And the AND gate 174 receives the LSB of the input register 140 and the bit currently output from the second shift register 180, obtains a logical product of these bits and then outputs the product to the exclusive OR gate 177.

Each of the exclusive OR gates 176 and 177 obtains an exclusive logical sum of the two inputs and then outputs the sum obtained to the exclusive OR gate 178. In response, the exclusive OR gate 178 obtains an exclusive logical sum of these two outputs and then outputs the sum as the convolutional code bit X1 to the second shift register 180.

That is to say, each bit stored on the input register 140 or first shift register 160 is input to associated one of the AND gates 171 through 174. And the outputs of these AND gates 171 through 174 are input to the exclusive OR gates 176 and 177, the outputs of which are then input to the exclusive OR gate 178 on the last stage. In other words, these three exclusive OR gates 176 through 178 together constitute a single exclusive OR gate for obtaining an exclusive logical sum of the respective outputs of the AND gates 171 through 174 and outputting the sum as the convolutional code bit X1. In this manner, the output of the logical operation section 170 can be a convolutional code bit X1 for the input bit sequence i.

In obtaining an exclusive logical sum of the outputs of the AND gates 171 through 174 using multiple exclusive OR gates, the number of gates between one AND gate 171, 172, 173 or 174 and the last-stage exclusive OR gate 178, which outputs the convolutional code bit X1, should be different from that of gates between another AND gate 171, 172, 173 or 174 and the exclusive OR gate 178 by one or less. Then, it is possible to shorten the time it takes to obtain the convolutional code bit X1 after the shift registers 160 and 180 shifted.

When the convolutional code bit X1 is obtained, the first shift register 160 shifts the bits stored one position to the left (i.e., toward the MSB). As a result, the bit that has just been output from the second shift register 180 (i.e., the MSB of the second shift register 180) is stored as the LSB of the first shift register 160. The second shift register 180 also shifts the bits stored one position to the left. Then, no bit of the input bit sequence is stored anymore as the LSB of the second shift register 180. Accordingly, the convolutional code bit X1, output from the logical operation section 170, is stored as the LSB of the second shift register 180.

As can be seen, if the first and second shift registers 160 and 180 shift their bits one position at a time, then the bit, which has been stored as the MSB of the second shift register 180, is input to the first shift register 160 next time. In response, the logical operation section 170 performs convolutional coding on this input bit to generate and output the next convolutional code bit X1. In this way, every time the first and second shift registers 160 and 180 shift their bits one position, the logical operation section 170 will output one convolutional code bit X1 after another by repeatedly performing similar operations after that.

Once the second shift register 180 has shifted out the input bit sequence by shifting the bits a number of times, the second shift register 180 transfers the convolutional code bit X1 stored to the data memory 110 to get the bit X1 stored at the address P1 on the memory 110. Then, the second shift register 180 newly retrieves another data word, beginning with the address P0 indicated by the address counter 120, from the data memory 110 and stores the data word thereon. By performing these operations numerous times, the coding apparatus 100 shown in FIG. 3 generates convolutional code bits X1 one by one consecutively.

In the foregoing illustrative embodiment, each convolutional code bit X1, output from the logical operation section 170, is once stored on the second shift register 180. Alternatively, each code bit X1 may be directly stored on the data memory 110 instead. In that case, the convolutional code bit X1 is stored at the address P1 in the data memory 110 as indicated by the address counter 120. For example, where one data word stored on the data memory 110 is composed of 16 bits, zero bits are stored as the most through $15^{th}$ most significant bits of each data word and the convolutional code bit X1 generated is stored as the LSB thereof. After having stored the convolutional code bit X1 on the data memory 110, the address counter 120 increments the address P1 by one.

To generate the convolutional code bit X2 shown in FIG. 2, the input register 140 stores the coefficients of respective terms of the generator polynomial $1+D^3$, which is used to generate the convolutional code bit X2, thereon in this order (i.e., "1", "0", "0" and "1") so that the coefficient of the highest-order term is stored as the MSB thereof. In the other respects, the coding apparatus 100 operates in the same way as in generating the convolutional code bit X1.

In this manner, the coding apparatus 100 shown in FIG. 3 can generate a convolutional code bit in accordance with any arbitrary generator polynomial by storing the coefficients of the polynomial on the input register 140.

As described above, the coding apparatus 100 inputs the respective bits stored on the input register 140 and the associated bits of the first shift register 160 to the AND gates 171 through 174, thereby realizing bit selection. For that reason, compared to the known processor shown in FIG. 9 where the unit construction blocks 783 are cascaded, the inventive coding apparatus is implementable at a reduced circuit size. In addition, the exclusive OR gates 176 through 178 are connected in parallel to each other and the AND gates 171 through 174 are also connected in parallel. Accordingly, the number of gate stages needed can be reduced and the processing can be speeded up.

Embodiment 2

FIG. 4 is a block diagram illustrating a basic configuration for a coding apparatus for generating a turbo code sequence. As shown in FIG. 4, the apparatus includes recursive systematic convolutional (RSC) coders 401 and 402 and interleaver 403.

In the apparatus shown in FIG. 4, the RSC coder 401 performs recursive systematic coding on an input bit sequence i to generate and output an RSC code bit X21. The interleaver 403 interleaves, or rearranges, the bits included in the input bit sequence i and outputs the interleaved bit sequence to the RSC coder 402. In response, the RSC coder 402 performs recursive systematic coding on the input, interleaved bit sequence to generate and output another RSC code bit X22. Thereafter, the input bit sequence i and the RSC code bits X21 and X22 are subjected to decimation and multiplexing, the result of which is output as a turbo code sequence.

Figure 5:
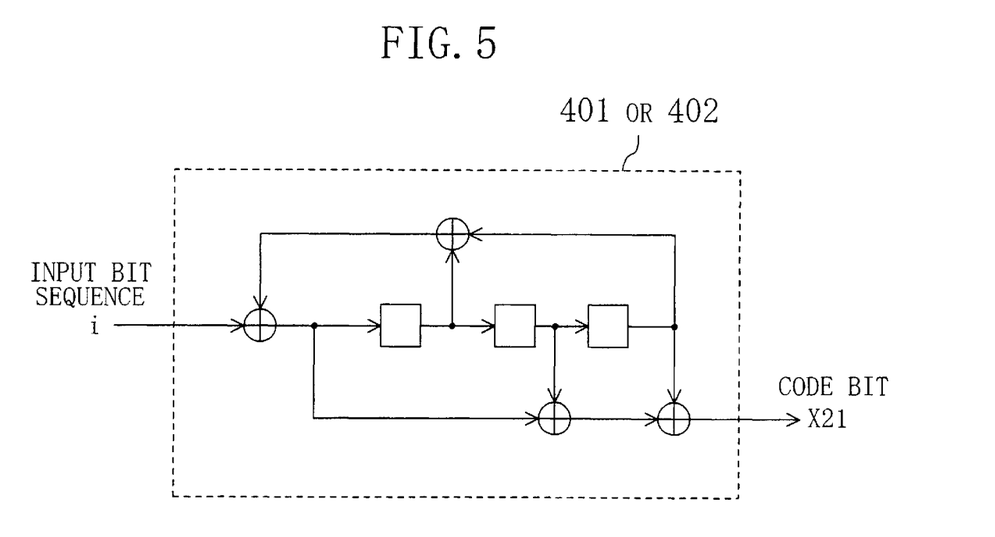
FIG. 5 is a block diagram illustrating a conceptual configuration for a recursive systematic convolutional coder.

FIG. 5 is a block diagram illustrating a conceptual configuration for the RSC coder 401. In FIG. 5, each square represents one bit of a shift register. The RSC code bit X21 may be generated in accordance with a generator polynomial $(1+D^2+D^3)/(1+D+D^3)$, for example. The other RSC coder 402 also has a similar configuration corresponding to its associated generator polynomial. As can be seen from FIG. 5, the RSC coders 401 and 402 each include a feedback loop.

Figure 6:
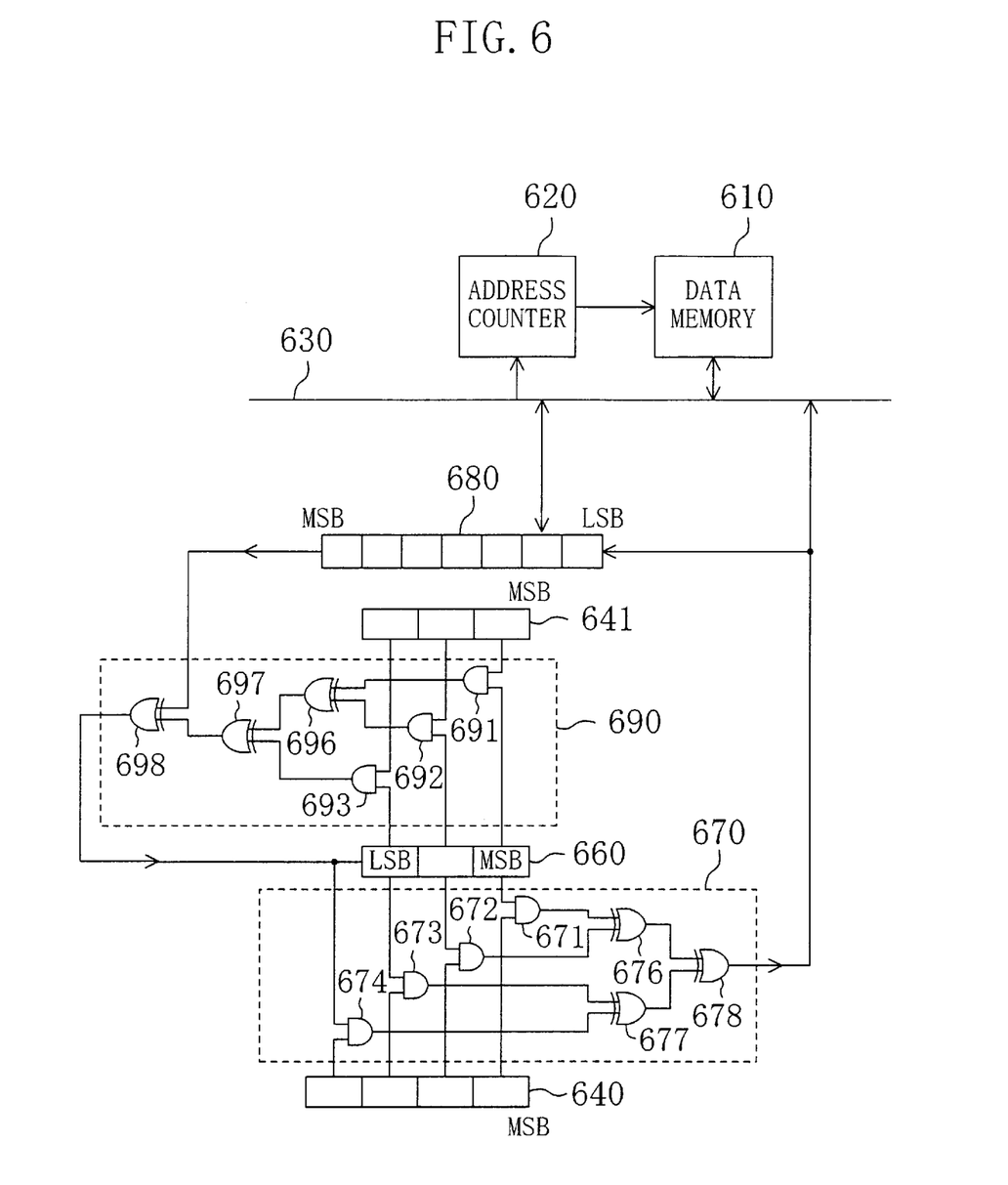
FIG. 6 is a circuit diagram illustrating a coding apparatus according to a second embodiment of the present invention.

FIG. 6 is a circuit diagram illustrating a coding apparatus according to a second embodiment of the present invention. In the following example, it will be described how the apparatus shown in FIG. 6 generates the RSC code bit X21 shown in FIG. 5. As shown in FIG. 6, the apparatus includes data memory 610, address counter 620, first and second input registers 641 and 640, first and second shift registers 660 and 680 and first and second logical operation sections 690 and 670.

The data memory 610, address counter 620, first and second shift registers 660 and 680 and second logical operation section 670 are the same as the counterparts 110, 120, 160, 180 and 170 of the apparatus 100 shown in FIG. 3, and the description thereof will be omitted herein.

That is to say, the coding apparatus shown in FIG. 6 includes not only components normally provided for a general purpose DSP but also the first and second logical operation sections 690 and 670.

The second input register 640 stores the coefficients of respective terms of a generator polynomial $1+D^2+D^3$ thereon in this order (i.e., "1", "0", "1" and "1") so that the coefficient of the highest-order term is stored as the MSB thereof. The first input register 641 stores the coefficients of respective terms of another generator polynomial $1+D+D^3$ thereon in this order except the $0^{th}$-order term (i.e., "1", "0" and "1") so that the coefficient of the highest-order term is stored as the MSB thereof. In a polynomial representing feedback, the coefficient of its $0^{th}$-order term is always one. Accordingly, the coefficient of this term is not input to the first input register 641.

The data memory 610 reads out and outputs a data word beginning with the address P0 as indicated by the address counter 620 so that the data word is transferred through the data bus 630 and then stored on the second shift register 680. Then, the address counter 620 increments the address P0 by one.

The second shift register 680 outputs the MSB of the data that has been stored thereon. And the MSB output is input to the first logical operation section 690. That is to say, the MSB is the bit currently input to the first logical operation section 690. The first logical operation section 690 outputs a bit, representing the result of operation, to the first shift register 660. The first shift register 660 can store three bits that were input thereto in the previous three cycles before the operation result is input thereto. The first shift register 660 stores zero bits at all these three bit positions for initialization purposes.

As shown in FIG. 6, the first logical operation section 690 includes AND gates 691, 692 and 693 and exclusive OR gates 696, 697 and 698. The first logical operation section 690 obtains logical products of the three bits stored on the first shift register 660 and the associated bits stored on the first input register 641. Next, the first logical operation section 690 derives an exclusive logical sum of the logical products obtained and the bit currently input to the first logical operation section 690, and then outputs the sum to the first shift register 660.

Specifically, the AND gate 691 receives the MSBs of the first input register 641 and first shift register 660, obtains a logical product of these bits and then outputs the product to the exclusive OR gate 696. The AND gate 692 receives the second most significant bits of the first input register 641 and first shift register 660, obtains a logical product of these bits and then outputs the product to the exclusive OR gate 696.

And the AND gate 693 receives the third most significant bits of the first input register 641 and first shift register 660, obtains a logical product of these bits and then outputs the product to the exclusive OR gate 697.

The exclusive OR gate 696 obtains an exclusive logical sum of the two inputs and then outputs the sum obtained to the exclusive OR gate 697. In the same way, the exclusive OR gate 697 obtains an exclusive logical sum of the two inputs and then outputs the sum obtained to the exclusive OR gate 698. The MSB of the second shift register 680 is input to the exclusive OR gate 698. The exclusive OR gate 698 obtains an exclusive logical sum of the two inputs and then outputs the sum obtained to the first shift register 660 and second logical operation section 670.

The second logical operation section 670 is the same as the counterpart 170 shown in FIG. 3, and the description thereof will be omitted herein. The output of the second logical operation section 670 is an RSC code bit X21 of the input data. The second logical operation section 670 outputs the RSC code bit X21 to the second shift register 680.

When the RSC code bit X21 is obtained, the first shift register 660 shifts the bits one position to the left. As a result, the bit that has just been output from the first logical operation section 690 is stored as the LSB of the first shift register 660. The second shift register 680 also shifts the bits one position to the left. Then, no bit of the input bit sequence is stored anymore as the LSB of the second shift register 680. Accordingly, the RSC code bit X21, output from the second logical operation section 670, is stored as the LSB of the second shift register 680.

As can be seen, if the first and second shift registers 660 and 680 shift the bits one position at a time, then the bit, which has been stored as the MSB of the second shift register 680, is input to the first logical operation section 690 next time. In response, the first and second logical operation sections 690 and 670 perform recursive systematic convolutional coding on this input bit to generate and output the next RSC code bit X21. In this way, every time the first and second shift registers 660 and 680 shift the bits one position, the second logical operation section 670 will output one RSC code bit X21 after another by repeatedly performing similar operations after that.

Once the second shift register 680 has shifted out the input bit sequence by shifting the bits repeatedly, the second shift register 680 transfers the RSC code bit X21 stored to the data memory 610 to get the bit X21 stored at the address P1 on the memory 610. Then, the second shift register 680 newly retrieves another data word, beginning with the address P0 indicated by the address counter 620, from the data memory 610 and stores the data word thereon. By performing these operations numerous times, the coding apparatus shown in FIG. 6 generates RSC code bits X21 one by one consecutively.

In the foregoing illustrative embodiment, the RSC code bit X21, output from the second logical operation section 670, is once stored on the second shift register 680. Alternatively, the code bit X21 may be directly stored on the data memory 610 instead. In that case, the coding apparatus shown in FIG. 6 operates in the same way as the counterpart shown in FIG. 3.

To generate the RSC code bit X22, the first and second input registers 641 and 640 store the respective coefficients of a generator polynomial corresponding to the code bit X22. In the other respects, the coding apparatus operates in the same way as in generating the RSC code bit X21.

In this manner, the coding apparatus shown in FIG. 6 can generate an RSC code bit in accordance with any arbitrary generator polynomial by storing the coefficients of the polynomial on the first and second input registers 641 and 640.

As described above, the coding apparatus shown in FIG. 6 inputs the respective bits stored on the first input register 641 and the associated bits of the first shift register 660 to the AND gates 691 through 693, thereby realizing bit selection. For that reason, compared to the known processor shown in FIG. 9 where the unit construction blocks 783 are cascaded, the inventive coding apparatus is implementable at a reduced circuit size. In addition, the exclusive OR gates 696 through 698 are connected in parallel to each other and the AND gates 691 through 693 are also connected in parallel. Accordingly, the number of gate stages needed can be reduced and the processing can be speeded up.

Figure 7:
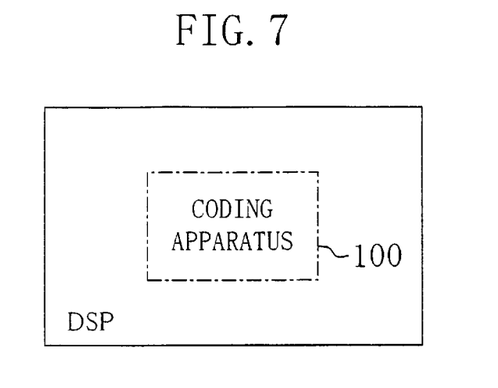
FIG. 7 is a block diagram schematically illustrating a DSP including the coding apparatus shown in FIG. 3.

FIG. 7 is a block diagram schematically illustrating a DSP including the coding apparatus 100 shown in FIG. 3. As shown in FIG. 7, the DSP includes the coding apparatus 100 and the DSP and coding apparatus 100 are integrated together on the same semiconductor substrate to form a single chip. The DSP shown in FIG. 7 shifts the bits of the first and second shift registers 160 and 180 one position at a time by executing a single instruction. Accordingly, the DSP can generate a convolutional code bit just by performing a single processing step.

Alternatively, the DSP shown in FIG. 7 may include the coding apparatus shown in FIG. 6 instead of the apparatus 100 shown in FIG. 3. In that case, the DSP shown in FIG. 7 shifts the bits of the first and second shift registers 660 and 680 one position at a time by executing a single instruction. Accordingly, the DSP can generate an RSC code bit just by performing a single processing step.

In getting a program executed by a known DSP using normal instructions, it usually takes several processing steps to code an input bit and obtain one code bit. In contrast, the inventive coding apparatus shown in FIG. 3 or 6 needs just one processing step to do so, and can perform coding much faster.

In the foregoing embodiments, the present invention has been described using some specific generator polynomials. It should be noted, however, that various generator polynomials other than those used for those embodiments may also be used.

As is apparent from the foregoing description, the present invention makes it possible to generate a convolutional code sequence in a reduced number of processing steps using a circuit of a reduced size.

What is claimed is:

1. A coding apparatus comprising:
   a first shift register for performing bit shifting on an input bit sequence and storing each bit of the input bit sequence in a sequential manner;
   an input register for storing coefficients of terms of respective orders of a generator polynomial; and
   a logical operation section for obtaining:
      logical products of the respective bits stored in the first shift register and corresponding coefficients of terms stored in the input register,
      a logical product of a next bit of the input bit sequence to be input into the first shift register and a corresponding coefficient of term stored in the input register; and
      deriving an exclusive logical sum of the logical products obtained; and then outputting the sum as one bit of a code sequence,
   wherein each time a given bit of the input bit sequence is shifted into said first shift register, said given bit corresponds with a higher order of the coefficients of terms of the generator polynomial stored in said input register.

2. The apparatus of claim 1, further comprising a second shift register for storing the input bit sequence thereon,
wherein the second shift register performs bit shifting on the input bit sequence and outputs one bit of the input bit sequence after another to the first shift register.

3. The apparatus of claim 2, further comprising a memory for storing and then outputting the input bit sequence,
wherein the logical operation section gets the code sequence stored on the memory.

4. The apparatus of claim 2, wherein the logical operation section outputs the code sequence to the second shift register, and
wherein the second shift register allocates one bit of the code sequence after another to a bit position at which no bit of the input bit sequence is stored anymore as a result of the bit shifting.

5. A digital signal processor comprising
the coding apparatus recited in claim 2 and
an arithmetic and logic unit,
wherein the input register is connected to the arithmetic and logic unit.

6. A digital signal processor comprising the coding apparatus recited in claim 2, the digital signal processor and the coding apparatus being integrated together on the same semiconductor substrate.

7. The apparatus of claim 1, wherein the logical operation section comprises:
a plurality of AND gates for obtaining the respective logical products; and
a plurality of exclusive OR gates for obtaining the exclusive logical sum,
wherein the number of gates existing between one of the AND gates and a last-stage one of the exclusive OR gates is different from the number of gates existing between another one of the AND gates and the last-stage exclusive OR gate by no greater than one.

8. A coding apparatus comprising:
a shift register for performing bit shifting and storing one input bit after another;
a first input register for storing coefficients of terms on respective orders of a first generator polynomial;
a second input register for storing coefficients of terms on respective orders of a second generator polynomial;
a first logical operation section; and
a second logical operation section,
wherein the first logical operation section:
obtains logical products of the respective bits stored in the shift register and corresponding coefficients of terms of said first generator polynomial, wherein each time a given bit is shifted into said shift register, said given bit corresponds with a higher order of the coefficients of terms of the first generator polynomial stored in the first input register; and
derives an exclusive logical sum of the logical products obtained and a bit of an input bit sequence, which bit is currently input to the first logical operation section; and then outputs the sum to the shift register, and
wherein the second logical operation section:
obtains logical products of the respective bits stored in the shift register and corresponding coefficients of terms of said second generator polynomial stored in the second input register;
a logical product of a next bit to be input into the shift register and a corresponding coefficient of term of the second generator polynomial stored in the second input register wherein each time a given bit is shifted into said shift register, said given bit corresponds with a higher order of the coefficients of terms of the second generator polynomial stored in the second input register; and
derives an exclusive logical sum of the logical products obtained; and then outputs the sum as one bit of a code sequence.

9. A coding method comprising the steps of:
performing bit shifting on an input bit sequence and storing each bit of the input bit sequence in a sequential manner in a shift register;
obtaining logical products of the respective bits stored in the shift register and corresponding coefficients of terms of respective orders of a generator polynomial stored on an input register; and a logical product of a next bit of the input bit sequence to be input into the shift register and a corresponding coefficient of term stored in the input register; and
deriving an exclusive logical sum of the logical products obtained and then outputting the sum as one bit of a code sequence.

10. A digital signal processor, which realizes the coding method recited in claim 9 by executing a single instruction.

11. A coding method comprising the steps of:
performing bit shifting and storing one input bit after another in a shift register;
obtaining logical products of the respective bits stored in the shift register and corresponding coefficients of terms of a first generator polynomial, said coefficient of terms of the first generator polynomial being stored in a first input register, wherein each time a given bit is shifted into said shift register, said given bit corresponds with a higher order of the coefficients of terms of the first generator polynomial;
deriving an exclusive logical sum of the logical products obtained and a bit of an input bit sequence, which bit is currently input to the shift register, and then outputting the sum to the shift register;
obtaining logical products of the respective bits stored in the shift register and corresponding coefficients of terms of a second generator polynomial stored in a second input register; and a logical product of a next bit to be input into the shift register and a corresponding coefficient of term of the second polynomial stored in the second input register, wherein each time a given bit is shifted into said shift register, said given bit corresponds with a higher order of the coefficients of terms of the second generator polynomial stored in the second input register, and
deriving an exclusive logical sum of the logical products obtained and then outputting the sum as one bit of a code sequence.

12. A digital signal processor, which realizes the coding method recited in claim 11 by executing a single instruction.

* * * * *